United States Patent [19]

Ito et al.

[11] Patent Number: 4,591,814
[45] Date of Patent: May 27, 1986

[54] ELECTRONIC COMPONENT COMPRISING PRINTED CIRCUIT ELEMENTS DISPOSED ON A FOLDED TAPE AND METHOD OF MAKING SUCH COMPONENT

[75] Inventors: Katsuo Ito; Yasushi Senga, both of Kanazawa; Yoshio Murata, Unoke, all of Japan

[73] Assignee: Murata Manufacturing Co., Ltd., Japan

[21] Appl. No.: 504,238

[22] Filed: Jun. 14, 1983

[30] Foreign Application Priority Data

Jun. 16, 1982 [JP] Japan ................. 57-104639

[51] Int. Cl.⁴ .............................. H05K 1/16
[52] U.S. Cl. ......................... 333/177; 333/185; 336/200; 336/232; 361/400; 361/398; 29/831; 29/846; 29/592 R
[58] Field of Search ............... 333/175, 140, 167, 177, 333/203, 204; 336/200, 232; 29/592 R, 593, 602 R, 29.25, 831, 832, 837, 842, 846; 361/400, 402, 398

[56] References Cited

U.S. PATENT DOCUMENTS

| 2,874,360 | 2/1959 | Eisler | 336/200 |
| 2,943,966 | 7/1960 | Lens et al. | 336/200 |
| 3,002,260 | 10/1961 | Shortt et al. | 29/602 |
| 3,560,904 | 2/1971 | Wilkes | 336/200 X |
| 3,689,684 | 9/1972 | Cox, Jr. et al. | 361/402 X |
| 4,298,848 | 11/1981 | Kurose | 333/185 X |
| 4,313,151 | 1/1982 | Vranken | 336/200 X |
| 4,313,152 | 1/1982 | Vranken | 336/200 X |
| 4,342,143 | 8/1982 | Jennings | 336/200 X |
| 4,369,557 | 1/1983 | Vandebult | 336/200 X |

FOREIGN PATENT DOCUMENTS 0601960 7/1978 Switzerland ................. 29/831

Primary Examiner—Eugene R. LaRoche
Assistant Examiner—Benny T. Lee
Attorney, Agent, or Firm—Ostrolenk, Faber, Gerb & Soffen

[57] ABSTRACT

An electronic component made by the steps of: preparing elongated tape (10), distributing a plurality of pairs of electronic elements (1) over the tape (10) lengthwise of the latter and bonding the pairs to the tape (10) in such a manner that the two elements (1) in each pair are positioned one in each of the first and second regions (12, 13) of the tape (10) separated from each other substantially by the longitudinal centerline (11) of the tape (10), folding the tape (10) along the longitudinal centerline (11) so that the two elements (1) in each pair are opposed at least partially to each other, preparing a terminal assembly (18) having a frame (17) on which a plurality of terminals (14, 15, 16) to be connected to the elements (1) are held so that they are distributed lengthwise of the frame (17), arranging the frame (17) parallel to the tape (10) and effecting connection between the terminals (14, 15, 16) and the elements (1), cutting the tape (10) along widthwise extending cutting lines to separate the sets of elements (1) from each other, and cutting off the terminals (14, 15, 16) from the frame (17).

11 Claims, 14 Drawing Figures

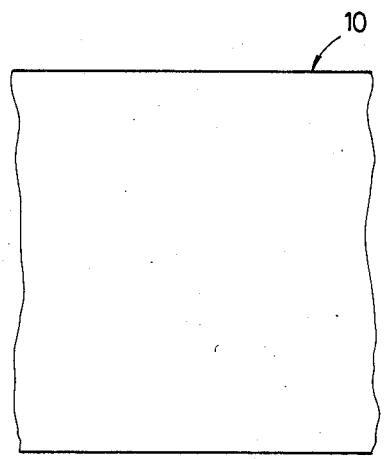
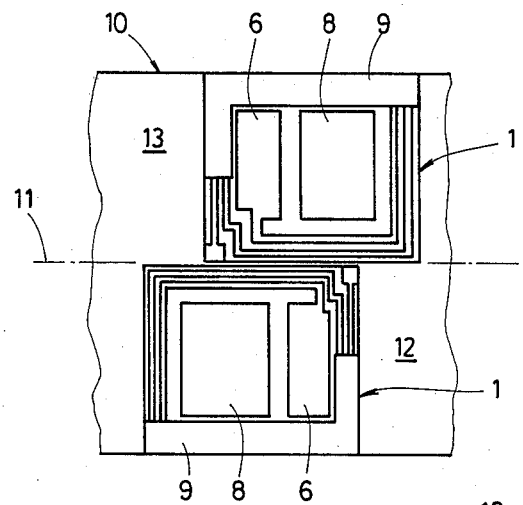
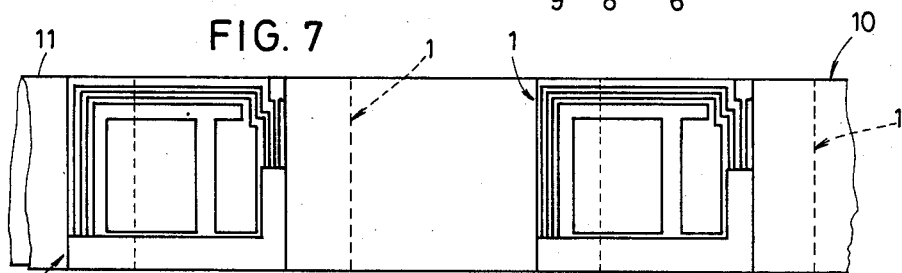
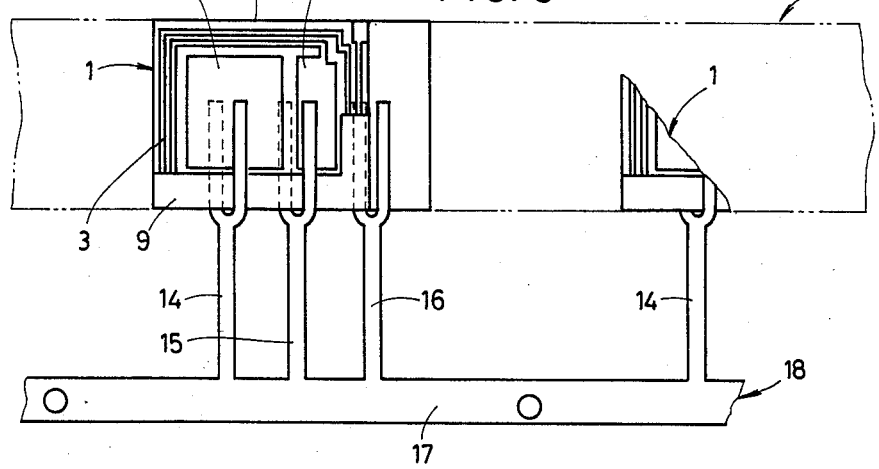

ELECTRONIC COMPONENT COMPRISING PRINTED CIRCUIT ELEMENTS DISPOSED ON A FOLDED TAPE AND METHOD OF MAKING SUCH COMPONENT

BACKGROUND OF THE INVENTION

1. Field of the Invention

This invention relates to an electronic component and more particularly to the construction of such an electronic component in which two or more elements are coupled to form a single electronic component.

While the invention is applicable to various electronic components, it is particularly advantageous if applied to LC filters having M coupling.

2. Description of the Prior Art

LC filters and the like are composed, most typically, of discrete components. With such systems, however, the space occupied by a filter is large, which interferes with miniaturization of any device using such a filter. One possible solution to this problem might be to use separate boards each to form one of the respective portions separated from each other by the M coupling portion. Such boards would be bonded to the opposite surfaces of a block which produces suitable M coupling, thus forming an LC filter. However, for such a system to be used in a miniature circuit, the boards and block must be very small. This makes handling, for example, during the assembling operation, in the manufacturing process difficult.

SUMMARY OF THE INVENTION

Accordingly, a principal object of the present invention is to provide an electronic component which facilitates the assembling operation and can be easily miniaturized and which includes at least two elements which are constructed as a single part.

This invention is characterized by the use of a tape which is folded along one fold. At least two elements are bonded each to the surface of one of the first and second regions separated from each other by the fold in the tape as a boundary. Each element has a suitable terminal electrically connected thereto and in some cases cladding resin is applied to the element including the connections between the elements and the terminals.

According to the described feature of the invention, the tape is prepared as a relatively long-sized one with the intention of cutting it into predetermined lengths afterwards. Elements are then bonded to this relatively long tape so that they are distributed lengthwise of the tape at predetermined intervals. The fold is formed preferably lengthwise of the tape and hence elements will be arranged widthwise of the tape. The surface of the tape to which elements are bonded may be the face or the back of the tape. Preferably, it is so selected that when the tape is folded along the fold, the elements are disposed to hold the tape therebetween. Further, it is desirable that the terminals be attached to the elements before the tape is cut. Subsequently, the tape is cut and thereafter, in some cases, cladding resin is applied to the elements to cover the elements and the connections between the elements and terminals. When the aforesaid tape is cut, each length of the tape constitutes a single electronic component. Thus, according to the invention, although the elements are small, they can be handled in the manufacturing process through a tape which is relatively long, i.e., not so small as to make handling difficult, thus enabling the manufacturing process to proceed with ease. Therefore, the elements and hence electronic components obtained by using them can be miniaturized without any problem. Further, the elements with which to obtain a plurality of electronic components can, if necessary, be distributed lengthwise of the relatively long tape and bonded thereto, in which case it is possible to allow attachment of terminals and application of cladding resin to proceed at the same time with respect to a plurality of electronic components, so that a number of electronic components can be produced efficiently.

In a preferred embodiment of the invention, the individual elements used constitute individual portions which are separated from each other at the M coupling portion of an LC filter, and there is obtained an LC filter which is M coupled through the tape. When this invention is applied to an LC filter, M coupling can be easily obtained. Further, since the two elements forming a single LC filter are bonded to and held on the tape in advance, positioning can be effected with good reproducibility; for example, the degree of M coupling can be easily adjusted by using a suitable space for adjusting the distance between the two elements or by shifting the opposite positions of the elements.

Other objects and features of this invention will become more apparent from the detailed description to be given with reference to the drawings.

BRIEF DESCRIPTION OF THE DRAWINGS

FIGS. 5 and 10 successively illustrate the processing steps for obtaining electronic components having the circuit of FIG. 1.

DESCRIPTION OF THE PREFERRED EMBODIMENTS

Figure 1:
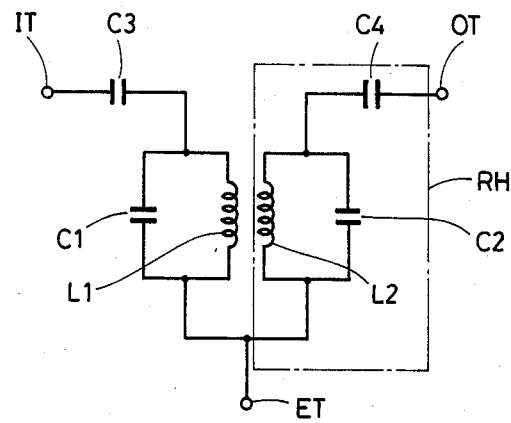
FIG. 1 shows a structural example of a circuit intended to be obtained by an embodiment of the present invention.

FIG. 1 shows a structural example of a circuit to be obtained by an embodiment of this invention. The circuit shown therein forms an LC filter. That is, it includes a pair of coils L1 and L2 which are M coupled with each other, the coils L1 and L2 being connected in parallel with capacitors C1 and C2, respectively. The parallel combination of the coil L1 and the capacitor C1 has a capacitor C3 connected in series therewith, one end of the capacitor C3 serving as an input terminal IT. The parallel combination of the coil L2 and the capacitor C2 has a capacitor C4 connected in series therewith, one end of the capacitor C4 serving as an output terminal OT. The other ends of the coils L1 and L2 and capacitors C1 and C2 are connected to a common ground terminal ET. As is clear from FIG. 1, the circuit shown therein has symmetrical right and left portions each being formed of an element to be described below. The following description refers to the arrangement of the right half element RH, a detailed description with respect to the left half being omitted since it is identical to the right half except for being a mirror image thereof.

Figure 2:
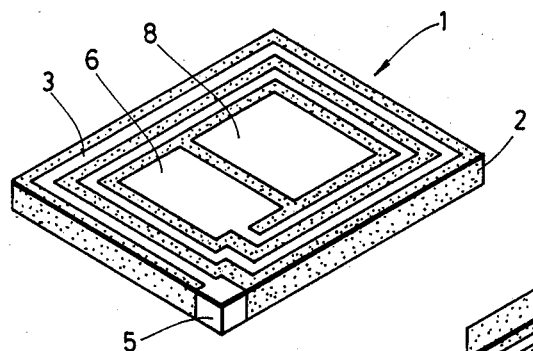
FIG. 2 is a top perspective view looking at an element sharing the right half of the circuit of FIG. 1.
Figure 3:
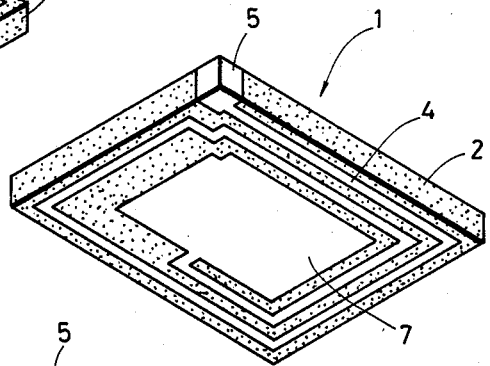
FIG. 3 is a bottom perspective view of the element of FIG. 2.
Figure 4:
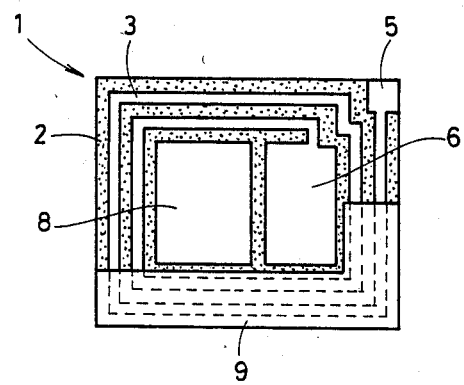
FIG. 4 is a top view of the element of FIG. 2, having an insulating film applied thereto.

FIG. 2 is a top perspective view of the element sharing the right half of the circuit of FIG. 1. FIG. 3 is a bottom perspective view of the element of FIG. 2. FIG. 4 is a top view of the element of FIG. 2, with an insulating film applied thereto.

The element 1 includes a dielectric plate 2, e.g., of ceramic material and has a metal film on its surface which forms the coil L2 and the capacitors C2 and C4. The formation of this metal film is performed as by printing or vapor deposition. In FIGS. 2 through 4, the metal film is illustrated as a white background.

The coil L2 is formed of metal strips 3 and 4 each extending in circinate form with a narrow width along the periphery of the dielectric plate 2. One metal strip 3 is formed on the upper surface of the dielectric plate 2 and the other metal strip 4 on the lower surface of the dielectric plate 2. The two metal strips 3 and 4 are electrically interconnected by a connecting strip 5 extending across the lateral surface of the dielectric plate 2. The capacitor C2 has, as one electrode, an electrode 6 formed on the upper surface of the dielectric plate 2 and connected to the metal strip 3 and as the other electrode an electrode 7 formed over a relatively wide region on the lower surface of the dielectric plate 2. The electrode 7 is connected to a metal strip 4. The capacitor C4 has as one electrode an electrode 8 formed on the upper surface of the dielectric plate 2, the other electrode thereof being the other portion of said electrode 7. With the metal film thus formed, if the electrodes 6 and 8 are used as the ground terminal ET and the output terminal OT, respectively, the circuit of the right half RH of FIG. 1 can be obtained.

In FIG. 4, an insulating film 9 is formed to cover a portion of the region of the dielectric plate 2 where the metal film is formed. The insulating film 9 serves to prevent terminals to be later described from contacting the metal strip 3 when they are connected to the electrodes 6 and 8. By changing the pattern of formation of the metal film, it is possible to arrange it so that no metal film lies in the positions where the terminals to be connected to the electrodes 6 and 8 pass.

As for the element 1 described with reference to FIGS. 2 and 4, two such elements are prepared for a single LC filter, and an LC filter having the circuit arrangement shown in FIG. 1 is obtained through manufacturing steps described below.

FIGS. 5 through 10 successively show the steps for obtaining an LC filter having the circuit of FIG. 1 by using the elements shown in FIGS. 2 through 4.

Referring to FIG. 5, first a tape 10 is prepared. This tape 10 is made of insulating and heat-resistant material. The tape 10 may be a sheet in the form of a film made of such material or it may be a sheet formed by weaving filaments of such material. Although only a portion of the tape 10 is shown in FIG. 5, actually it extends long in the direction of the length (i.e., it is elongated).

Referring to FIG. 6, the element 1 is bonded to one surface of the tape 10. The tape 10 will be folded along a fold 11 shown in a dash-dot line, so that the elements 1 are arranged one on each of the first and second regions 12 and 13 of the tape 10 separated from each other by the fold 11. The two elements 1 shown in FIG. 6 will be later integrated to form a single LC filter. The two elements 10 are shifted from each other, to make it possible for a single connecting terminal to interconnect the two electrodes 6 of the two elements 1.

As for the manner of bonding the elements 1 to the tape 10, the following may be employed. A first method is to apply an adhesive agent to the tape 10 in advance to thereby bond the elements 1 to the tape 10. In this case, as will become clear from the manufacturing process to be later described, the tape 10 may have an adhesive agent applied to the other surface thereof as well. Further, rather than applying an adhesive agent to the tape 10 in advance, it may be applied to the elements 1 in advance for bonding to the tape 10. In addition, the bonding of the elements 1 to the tape 10 may be effected by progressively moving the tape 10 in the direction of its length while feeding the elements 1 onto the tape 10, whereby it is possible to efficiently bond a number of elements 1 to the tape 10.

Referring to FIG. 7, the tape 10 is folded along the fold 11. In this case it is folded so that its surface to which the elements 1 have been bonded is on the outside. In this condition, if the tape 10 is one having an adhesive agent applied to its opposite surfaces, the folded state of the tape 10 can be firmly retained. If the tape 10, as shown in FIG. 7, has a plurality of elements 1 bonded thereto, the steps for obtaining a number of LC filters, including this folding step, can be progressed at the same time by performing each step only once. In FIG. 7, what are shown in dotted lines are the elements 1 positioned on the back side of the tape as a result of folding back the tape 10.

Referring to FIG. 8, the step of connecting terminals is performed. As shown in FIG. 1, this LC filter has three terminals IT, OT and ET. For efficient connection of terminals, a terminal assembly 18 is used which has a frame 17 carrying sets of three terminals 14, 15, and 16 distributed lengthwise thereof. The positioning between adjacent terminals 14, 15, and 16 in the terminal assembly 18 corresponds to the positioning between the electrodes 6 and 8, and the distance between adjacent sets of three terminals 14, 15, and 16 corresponds to the distance between adjacent sets of elements 1 held on the tape 10.

Figure 9:
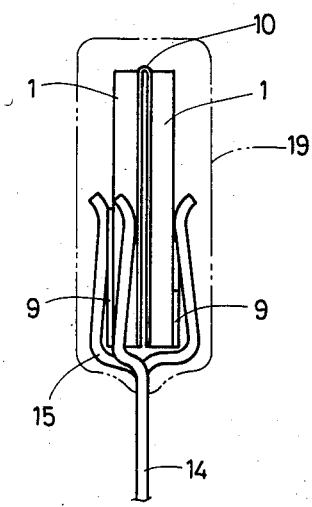

Referring to FIGS. 8 and 9, the terminals 14, 15, and 16 each form a pair of branches at their front ends arranged to hold the two elements 1 and the tape 10 or a single element 1 and the tape 10. Each pair of branches of the terminals holds the edge opposite to the fold 11 of the folded tape 10. The connection of the terminals 14, 15, and 16 and the electrodes is made as follows (in the following description, the side of the tape 10 which can be viewed directly in FIG. 8 will be called the "front side" and the side of the tape 10 lying behind the front side will be called the "back side"). The branch of the terminal 14 on the front side contacts the electrode 8 of the element 1 on the front side, while the branch on the back side does not contact the element 1 on the back side but rather contacts the back side of the tape 10. The branch of the terminal 15 on the front side contacts the electrode 6 of the element 1 on the front side, while the branch on the back side contacts the electrode 6 of the element 1 on the back side. Thus, the connection between the electrode 6 of the element 1 on the front side and the electrode 6 of the element 1 on the back side is made. The branch of the terminal 16 on the front side contacts the front side of the tape 10, while the branch on the back side contacts the electrode 8 of the element 1 on the back side. When such contacted condition is thus established, the correspondence to FIG. 1 is such that the terminal 14 becomes the input terminal IT or output terminal OT, the terminal 15 becomes the ground terminal ET, and the terminal 16 becomes the output terminal OT or input terminal IT.

The branches of the terminals 14, 15, and 16 also serve to mechanically hold the elements 1 and the tape 10. Therefore, if the front ends of the terminals 14, 15, and 16 are dipped in solder with the frame turned up, soldering between the terminals 14, 15, and 16 and the electrodes 6 and 8 is attained. Although the terminals 14, 15, and 16 extend close to the metal strip 3 forming the coils L1 and L2, since the latter are partly covered with the insulating film 9, as described previously, there is no possibility of forming undesirable electric connections.

Subsequently, the tape 10 is cut. what is shown in solid lines in FIG. 8 shows the state of the tape 10 after being cut; the cutting of the tape 10 removes excessive tape portions and establishes the state in which the sets of elements 1 are separated from each other.

Next, application of cladding resin is performed. This cladding resin 19, as shown in FIG. 9, is applied in such a manner as to enclose at least the elements 1 and the connections between the terminals 14, 15, and 16 and the elements 1. As for the material of which the cladding resin 19 is made, for example, modified phenol resin or modified epoxy resin is used. As for the formation of the cladding resin 19, a resin dipping or molding method or other method may be used.

Figure 10:
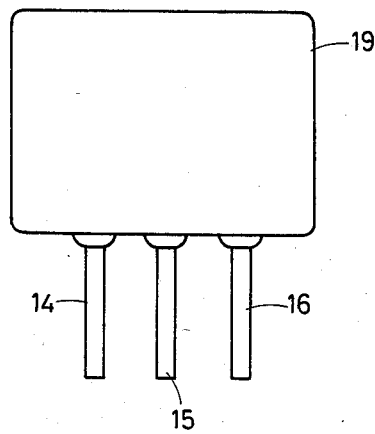

Finally, when the terminals 14, 15, and 16 are cut off from the frame 17, a finished product of LC filter shown in FIG. 10 is obtained.

In such finished product, the two elements 1 contained therein have been M coupled with the tape 10 interposed therebetween. In order to adjust the degree of M coupling, the following embodiments can be used.

Figure 11:
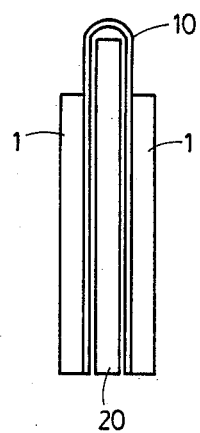
FIGS. 11 through 14 show other embodiments of the invention, respectively.

Referring to FIG. 11, a spacer 20 is interposed between the regions of the folded tape 10. It is not absolutely necessary that the spacer 20 be of an insulating nature, it is sufficient that it is capable of producing M coupling. By suitably selecting the thickness or material of such spacer 20, the degree of M coupling can be easily adjusted. For example, if a tape 10 having an adhesive agent applied to the opposite surfaces thereof, as described above, is used in this embodiment, the spacer 20 can be firmly held with respect to the tape 10 during manufacturing process without requiring any special holding means.

Figure 12:
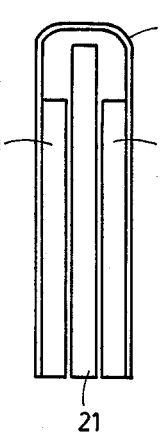

Referring to FIG. 12, there is shown an embodiment in which the direction in which the tape 10 is folded is in reverse to that for the preceding embodiments. That is, the elements 1 are positioned inside the folded tape 10. In this embodiment, an insulating spacer 21 is used, interposed between the two elements 1. The M coupling between the two elements 1 is attained by this insulating spacer 21.

In addition, in order to adjust the degree of M coupling, the elements 1 may be shifted from each other.

Figures 13, 14:
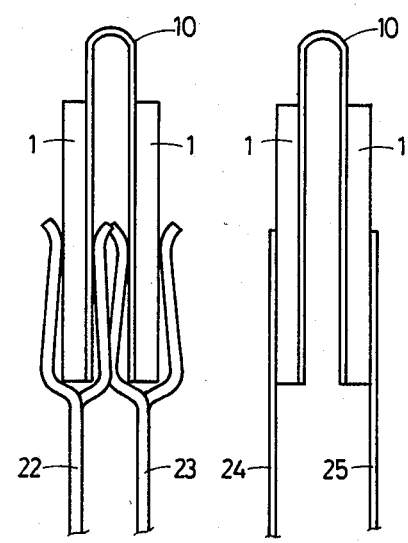

FIGS. 13 and 14 show other embodiments concerning the terminals. In the embodiments described previously, the terminal is formed with branches, which are positioned outside the structure formed of the two elements 1 and tape 10.

In the embodiment shown in FIG. 13, terminals 22 and 23 likewise have branches, but the terminals 22 and 23 are arranged to hold only one element 1 and one thickness of the tape 10 by their branches.

FIG. 14 shows terminals 24 and 25 having no branches. That is, the terminals 24 and 25 are simply in the form of plates or wires, and they are placed on suitable electrodes and in the condition soldering is applied thereto. Such terminals 24 and 25 will be advantageously used as in FIG. 12 embodiment where the terminals have to be led out from between the elements 1 and the spacer 21.

The embodiments concerning the terminals shown in FIGS. 13 and 14 may be used in combination with the embodiment concerning the terminals shown in FIGS. 8 and 9.

In the embodiments described so far, the terminals 14, 15, and 16 have been led out in a single-line manner, but other manners for leading out can be adopted.

Further, besides the case where terminals are formed as separate parts, portions of the board of the element may be projected and formed with an electrically conductive film, thereby forming terminals.

The cladding resin 19 is not absolutely necessary. The cladding resin often becomes unnecessary in cases where an adhesive agent is applied to the opposite surfaces of the tape 10, since the tape will be fixed in its folded state by the adhesive tape.

Although the tape 10 has been shown as being folded along a single fold 11, it may be folded along a greater number of folds and the electronic component may have three or more elements. In the case where the electronic component have three or more elements, it should be pointed out that in order for the elements to be positioned each between adjacent regions of the folded tape, it is sometimes necessary that the elements be bonded not only to one surface of the tape but also to the other surface thereof.

Further, the plurality of elements constituting one electronic component need not be the same. That is, there will be a case where depending upon an electronic component to be obtained, different elements are combined. In this connection, the invention is not limited to LC filters but is applicable, of course, to other electronic components such as bandpass amplifiers. That is, so long as two or more elements are required and it is advantageous if they are integrated as a single electronic component, the invention can be applied to any electronic component. For example, when two or more elements are driven by a common power source, it is advantageous if they are integrated, in which case they can be integrated to provide a single electronic component according to this invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component tape comprising:
   an electrically non conductive elongate tape having a length dimension and a width dimension, said tape being folded along the length dimension thereof to define a fold having a first region on one side of said fold and a second region on the other side of said fold;
   a plurality of pairs of first and second electrical elements located, respectively, on said first and second regions of said tape, each pair of elements being located spacedly along the length of said tape and generally such that when said tape is folded said first and second electrical elements overlap at least partially one another as to provide magnetic coupling between said elements; each one of said elements including:

a dielectric plate having first and second opposing surfaces;

a conductive pattern located on said opposing surfaces of said dielectric plate, said conductive pattern having a shape which defines an inductive element and a capacitive element; and a plurality of sets of terminals equal in number to the number of pairs of electrical elements, each set of terminals including at least one terminal and being electrically connected to a respective one of said pairs of elements, each pair of electrical elements being spaced from adjacent pairs of electrical elements to enable said tape to be cut into a plurality of individual electrical components each containing one of said pair of elements.

2. An electronic component, comprising:

(A) an electrically non-conductive tape having a length dimension and a width dimension, said tape being folded along the length dimension thereof to define a fold having a first region on one side of said fold and a second region on the other side of said fold, said tape having flat first and second opposing surfaces when said tape is in its unfolded state;

(B) first and second electrical elements located, respectively, on said first and second regions of said tape, each one of said elements including:

(1) a dielectric plate having first and second opposing surfaces;

(2) a conductive pattern located on said opposing surfaces, said conductive pattern having a section, generally spirally shaped which defines an inductive element and a section which includes electrodes arraanged on the plate to define a capacitive element; and (3) terminals electrically connected to said elements;

(C) said first element occupying a respective position on said first region and said second element occupying a respective position on said second region of said tape which are intended to provide a predetermined magnetic coupling between said first and second elements when said tape is folded.

3. An electronic component as set forth in claim 1, wherein each of said terminals includes a bifurcated section adapted to hold the tape and at least one of said elements therebetween.

4. An electronic component as set forth in claim 3, wherein: said first and second elements are bonded to said first and second regions, defined by one of said opposing surfaces of the tape, at positions which are shifted from each other lengthwise of the tape, said terminals comprise first, second and third terminals, the bifurcated section of said first terminal holds said first element and the tape, the bifurcated section of said second terminal holds said first and second elements and the tape, and said bifurcated section of said third terminal holds said second element and the tape.

5. An electronic component as set forth in claim 2, wherein the surface of said tape to which said elements are to be bonded has an adhesive agent applied thereto, so that the elements are bonded to the tape by said adhesive agent.

6. An electronic component as set forth in claim 2, wherein said elements are bonded to said tape by an adhesive agent which is applied to said elements.

7. An electronic component as set forth in claim 2, wherein said elements are bonded to one of said opposing surfaces of said tape.

8. An electronic component as set forth in claim 2, wherein said tape is folded so that said tape separates said elements, and wherein said first and second elements are located on one of said opposing surfaces of said tape whereby said elements are separated by a distance of at least twice the thickness of said tape.

9. An electronic component as set forth in claim 8, wherein each of said terminals includes a bifurcated section adapted to hold the tape and at least one of said elements therebetween, said bifurcated section holding an edge of the folded tape which is opposite to the fold.

10. An electronic component as set forth in claim 2, wherein each of said elements includes, a first metal film formed on the surface of said elements which is not adjacent said tape, said first metal film being located generally adjacent said fold defined in said tape and being adapted to be connected to one of said terminals, a second metal film formed on said surface on which said first film is located and adjacent the edge of said tape which is removed from said fold, and an insulating film formed on said second film to prevent contact between said one of said terminals and second second metal film.

11. An electronic component made by the steps of:

preparing an elongated electrically non conductive tape having length and width dimensions and a longitudinal center which extends along the length dimension thereof;

distributing a plurality of pairs of electrical elements, each pair including first and second elements, over said tape at spaced locations along the length of said tape and bonding said pairs to the tape in such a manner that the first and second elements in each pair are positioned in first and second regions of the tape, respectively, said regions being separated from each other substantially by the longitudinal center of said tape, each element comprising a dielectric plate having first and second flat opposing surfaces and a conductive pattern formed on said plate, said conductive pattern defining on said plate an inductive and a capacitive element;

folding said tape along said longitudinal center so that the two plates in each pair extend generally parallel to one another and overlap at least partially each other as to provide magnetic coupling between said elements;

preparing a terminal assembly having a frame which extends along the length of the tape, the frame holding a plurality of terminals to be connected to said elements;

arranging said franre parallel to the length of said tape an effecting connection between said terminals and said elements;

cutting said tape along widthwise extending cutting lines to separate said pairs of elements from each other; and cutting off said terminals from said frame.

* * * * *